(12) United States Patent
Niedernostheide et al.

(10) Patent No.: US 10,957,764 B2
(45) Date of Patent: Mar. 23, 2021

(54) VERTICAL SEMICONDUCTOR DEVICE

(71) Applicant: Infineon Technologies AG, Neubiberg (DE)

(72) Inventors: Franz Josef Niedernostheide, Hagen am Teutoburger Wald (DE); Manfred Pfaffenlehner, Munich (DE); Hans-Joachim Schulze, Taufkirchen (DE); Holger Schulze, Villach (AT); Frank Umbach, Munich (DE); Christoph Weiss, Munich (DE)

(73) Assignee: Infineon Technologies AG, Neubiberg (DE)

( * ) Notice: Subject to any disclaimer, the term of this patent is extended or adjusted under 35 U.S.C. 154(b) by 119 days.

(21) Appl. No.: 14/679,514

(22) Filed: Apr. 6, 2015

(65) Prior Publication Data

US 2015/0303260 A1    Oct. 22, 2015

(30) Foreign Application Priority Data

Apr. 16, 2014    (DE) .......................... 102014005879.4

(51) Int. Cl.
*H01L 29/66* (2006.01)
*H01L 29/06* (2006.01)
(Continued)

(52) U.S. Cl.
CPC ...... *H01L 29/0696* (2013.01); *H01L 23/3157* (2013.01); *H01L 29/0615* (2013.01);
(Continued)

(58) Field of Classification Search
CPC ............... H01L 29/0696; H01L 29/404; H01L 29/66136; H01L 29/66333; H01L 29/66712; H01L 29/7395; H01L 29/7811
(Continued)

(56) References Cited

U.S. PATENT DOCUMENTS 4,399,449 A * 8/1983 Herman ................ H01L 29/402
                                                                257/339
4,707,719 A * 11/1987 Whight ............... H01L 29/0619
                                                                257/489
(Continued)

FOREIGN PATENT DOCUMENTS

DE    102004059453 A1    8/2005
DE    102010011259 A1    10/2010
JP    WO 2014/050054    *    4/2014    ........... H01L 21/338

*Primary Examiner* — Jay C Kim
(74) *Attorney, Agent, or Firm* — Murphy, Bilak & Homiller, PLLC

(57) ABSTRACT

A semiconductor body includes first and second opposing surfaces, an edge extending in a vertical direction substantially perpendicular to the first surface, an active area, a peripheral area arranged in a horizontal direction substantially parallel to the first surface between the active area and edge, and a pn-junction extending from the active area into the peripheral area. In the peripheral area the semiconductor device further includes a first conductive region arranged next to the first surface, a second conductive region arranged next to the first surface, and arranged in the horizontal direction between the first conductive region and edge, and a passivation structure including a first portion at least partly covering the first conductive region, a second portion at least partly covering the second conductive region. The first portion has a different layer composition than the second portion and/or a thickness which differs from the thickness of the second portion.

9 Claims, 12 Drawing Sheets

(51) Int. Cl.
    *H01L 29/739*   (2006.01)
    *H01L 29/78*    (2006.01)
    *H01L 29/40*    (2006.01)
    *H01L 29/861*   (2006.01)
    *H01L 23/31*    (2006.01)
    *H01L 29/08*    (2006.01)
    *H01L 29/10*    (2006.01)
    *H01L 29/16*    (2006.01)
    *H01L 29/20*    (2006.01)

(52) U.S. Cl.
    CPC ...... *H01L 29/0619* (2013.01); *H01L 29/0834* (2013.01); *H01L 29/1095* (2013.01); *H01L 29/404* (2013.01); *H01L 29/6634* (2013.01); *H01L 29/66128* (2013.01); *H01L 29/66333* (2013.01); *H01L 29/66712* (2013.01); *H01L 29/66727* (2013.01); *H01L 29/7395* (2013.01); *H01L 29/7396* (2013.01); *H01L 29/7811* (2013.01); *H01L 29/8611* (2013.01); *H01L 29/0638* (2013.01); *H01L 29/1608* (2013.01); *H01L 29/20* (2013.01); *H01L 29/2003* (2013.01); *H01L 2924/0002* (2013.01)

(58) Field of Classification Search
    USPC .......................................................... 257/139
    See application file for complete search history.

(56) References Cited

U.S. PATENT DOCUMENTS

| | | | | |
|---|---|---|---|---|
| 4,904,613 A * | 2/1990 | Coe | H01L 29/0696 | 438/268 |
| 4,947,232 A * | 8/1990 | Ashida | H01L 29/405 | 257/336 |
| 4,996,586 A * | 2/1991 | Matsuda | H01L 23/051 | 257/633 |
| 5,003,372 A * | 3/1991 | Kim | H01L 29/402 | 257/330 |
| 5,043,781 A * | 8/1991 | Nishiura | H01L 27/0629 | 257/296 |
| 5,169,793 A * | 12/1992 | Okabe | H01L 29/1095 | 257/328 |
| 5,210,601 A * | 5/1993 | Kitagawa | H01L 24/72 | 257/133 |
| 5,250,449 A * | 10/1993 | Kuroyanagi | H01L 29/1095 | 438/137 |
| 5,270,568 A * | 12/1993 | Terashima | H01L 29/404 | 257/487 |
| 5,324,971 A * | 6/1994 | Notley | H01L 27/0255 | 257/133 |
| 5,376,566 A * | 12/1994 | Gonzalez | H01L 21/26586 | 257/E21.345 |
| 5,381,031 A * | 1/1995 | Shibib | H01L 23/60 | 257/488 |
| 5,439,835 A * | 8/1995 | Gonzalez | H01L 21/26586 | 257/E21.345 |
| 5,475,258 A * | 12/1995 | Kato | H01L 27/0255 | 257/603 |
| 5,521,409 A * | 5/1996 | Hshieh | H01L 21/02238 | 257/341 |
| 5,525,821 A * | 6/1996 | Harada | H01L 29/0619 | 257/331 |
| 5,550,067 A * | 8/1996 | Kuroyanagi | H01L 21/823456 | 257/E21.624 |
| 5,597,765 A * | 1/1997 | Yilmaz | H01L 29/402 | 438/270 |
| 5,614,751 A * | 3/1997 | Yilmaz | H01L 29/402 | 257/341 |
| 5,656,533 A * | 8/1997 | Kim | H01L 21/32133 | 148/DIG. 14 |
| 5,661,314 A * | 8/1997 | Merrill | H01L 29/66333 | 257/144 |
| 5,723,882 A * | 3/1998 | Okabe | H01L 29/1095 | 257/139 |
| 5,766,966 A * | 6/1998 | Ng | H01L 29/66333 | 148/DIG. 126 |
| 5,804,864 A * | 9/1998 | Akiyama | H01L 29/0615 | 257/336 |
| 5,856,239 A * | 1/1999 | Bashir | H01L 21/32137 | 216/67 |
| 5,864,167 A * | 1/1999 | Cutter | H01L 29/0638 | 257/489 |
| 5,885,879 A * | 3/1999 | Gardner | H01L 21/02238 | 257/E21.206 |
| 5,930,630 A * | 7/1999 | Hshieh | H01L 21/26586 | 438/268 |
| 5,973,359 A * | 10/1999 | Kobayashi | H01L 27/0251 | 257/328 |
| 6,040,219 A * | 3/2000 | Park | H01L 29/405 | 257/E21.358 |
| 6,274,443 B1 * | 8/2001 | Yu | H01L 21/266 | 257/E21.206 |
| 6,274,904 B1 * | 8/2001 | Tihanyi | H01L 29/0619 | 257/256 |
| 6,277,695 B1 * | 8/2001 | Williams | H01L 29/66719 | 438/268 |
| 6,284,637 B1 * | 9/2001 | Chhagan | H01L 21/28273 | 257/E21.209 |
| 6,287,922 B1 * | 9/2001 | Yu | H01L 21/28114 | 257/E21.205 |
| 6,300,171 B1 * | 10/2001 | Frisina | H01L 29/0619 | 257/E21.418 |
| 6,309,929 B1 * | 10/2001 | Hsu | H01L 29/0661 | 438/270 |
| 6,365,930 B1 * | 4/2002 | Schillaci | H01L 27/088 | 257/339 |
| 6,445,048 B1 * | 9/2002 | Pfirsch | H01L 21/763 | 257/329 |
| 6,448,611 B1 * | 9/2002 | Oh | H01L 29/402 | 257/335 |
| 6,451,645 B1 * | 9/2002 | Ozeki | H01L 27/0629 | 257/E21.418 |
| 6,495,866 B2 * | 12/2002 | Kawamoto | H01L 27/0647 | 257/175 |
| 6,512,268 B1 * | 1/2003 | Ueno | H01L 29/0634 | 257/341 |
| 6,521,497 B2 * | 2/2003 | Mo | H01L 29/0696 | 438/270 |
| 6,563,197 B1 * | 5/2003 | Wagers | H01L 29/7802 | 257/630 |
| 6,614,088 B1 * | 9/2003 | Beasom | H01L 27/0629 | 257/488 |
| 6,765,239 B2 * | 7/2004 | Hiyoshi | H01L 29/7395 | 257/107 |
| 6,855,986 B2 * | 2/2005 | Hsieh | H01L 29/7813 | 257/329 |
| 6,861,706 B2 * | 3/2005 | Tihanyi | H01L 29/0634 | 257/342 |
| 6,870,200 B2 * | 3/2005 | Yanagisawa | H01L 29/1095 | 257/133 |
| 6,870,201 B1 * | 3/2005 | Deboy | H01L 29/0634 | 257/170 |
| 6,888,206 B2 * | 5/2005 | Takahashi | H01L 29/0619 | 257/407 |
| 6,927,141 B2 * | 8/2005 | Andoh | H01L 29/32 | 257/E21.358 |
| 6,940,145 B2 * | 9/2005 | Blair | H01L 21/76229 | 257/510 |
| 6,987,305 B2 * | 1/2006 | He | H01L 27/0629 | 257/417 |
| 7,161,209 B2 * | 1/2007 | Saito | H01L 29/0634 | 257/328 |
| 7,189,608 B2 * | 3/2007 | Venkatraman | H01L 27/098 | 438/218 |
| 7,304,356 B2 * | 12/2007 | Takahashi | H01L 29/0619 | 257/328 |
| 7,317,227 B2 * | 1/2008 | Shiraishi | H01L 21/31116 | 257/353 |

(56) References Cited

U.S. PATENT DOCUMENTS

| | | | | |
|---|---|---|---|---|
| 7,525,178 B2* | 4/2009 | Kulinsky | H01L 29/0619 | 257/127 |
| 7,544,568 B2* | 6/2009 | Matsuura | H01L 29/8725 | 438/259 |
| 7,576,393 B2* | 8/2009 | Ono | H01L 29/0634 | 257/135 |
| 7,582,918 B2* | 9/2009 | Takahashi | H01L 29/0696 | 257/127 |
| 7,649,223 B2* | 1/2010 | Kawashima | H01L 29/0623 | 257/288 |
| 7,695,997 B2* | 4/2010 | Shimoida | H01L 27/0255 | 257/199 |
| 7,732,869 B2* | 6/2010 | Noguchi | H01L 27/0255 | 257/355 |
| 7,737,469 B2* | 6/2010 | Saito | H01L 29/872 | 257/197 |
| 7,750,398 B2* | 7/2010 | Hshieh | H01L 29/0661 | 257/330 |
| 7,750,428 B2* | 7/2010 | Hirler | H01L 21/765 | 257/409 |
| 7,825,474 B2* | 11/2010 | Noguchi | H01L 29/7804 | 257/355 |
| 7,973,363 B2* | 7/2011 | Hara | H01L 29/0657 | 257/138 |
| 7,973,381 B2* | 7/2011 | Chiola | H01L 29/0661 | 257/483 |
| 8,125,022 B2* | 2/2012 | Aoki | H01L 29/7811 | 257/328 |
| 8,174,067 B2* | 5/2012 | Yedinak | H01L 29/407 | 257/328 |
| 8,350,325 B2* | 1/2013 | Tamaki | H01L 29/7823 | 257/341 |
| 8,350,366 B2* | 1/2013 | Koenig | H01L 29/0619 | 257/171 |
| 8,450,828 B2* | 5/2013 | Suekawa | H01L 29/0619 | 257/173 |
| 8,552,428 B2* | 10/2013 | Honda | H01L 29/0615 | 257/329 |
| 8,637,368 B2* | 1/2014 | Bhalla | H01L 29/1095 | 438/259 |
| 8,642,401 B2* | 2/2014 | Inagawa | H01L 29/0615 | 438/138 |
| 8,642,479 B2* | 2/2014 | Lin | H01L 21/31144 | 438/710 |
| 8,680,613 B2* | 3/2014 | Guan | H01L 29/407 | 257/330 |
| 8,686,469 B2* | 4/2014 | Nakamura | H01L 23/3171 | 257/143 |
| 8,749,017 B2* | 6/2014 | Lu | H01L 29/66348 | 257/493 |
| 8,786,046 B2* | 7/2014 | Tamaki | H01L 29/7395 | 257/492 |
| 8,809,966 B2* | 8/2014 | Zundel | H01L 29/407 | 257/401 |
| 8,829,563 B2* | 9/2014 | Rahimo | H01L 29/0634 | 257/139 |
| 8,835,254 B2* | 9/2014 | Toyoda | H01L 21/823807 | 257/E21.655 |
| 8,866,215 B2* | 10/2014 | Pfirsch | H01L 29/7825 | 257/330 |
| 8,866,255 B2* | 10/2014 | Schulze | H01L 27/0207 | 257/513 |
| 8,872,245 B2* | 10/2014 | Shimatou | H01L 29/0619 | 257/288 |
| 8,907,374 B2* | 12/2014 | Zhu | H01L 29/0619 | 257/139 |
| 8,933,394 B2* | 1/2015 | Okada | H01L 25/167 | 250/208.1 |
| 8,969,929 B2* | 3/2015 | Sakanishi | H01L 29/4238 | 257/287 |
| 8,975,681 B2* | 3/2015 | Akiyama | H01L 27/02 | 257/302 |
| 9,006,819 B2* | 4/2015 | Hino | H01L 29/1095 | 257/328 |
| 9,012,311 B2* | 4/2015 | Pfirsch | H01L 21/221 | 257/612 |
| 9,093,310 B2* | 7/2015 | Takano | H01L 29/66333 | |
| 9,105,715 B2* | 8/2015 | Miura | H01L 29/4916 | |
| 9,153,653 B2* | 10/2015 | Padmanabhan | H01L 29/407 | |
| 9,246,410 B2* | 1/2016 | Hirler | H01L 27/0629 | |
| 9,287,391 B2* | 3/2016 | Chen | H01L 29/7397 | |
| 9,355,958 B2* | 5/2016 | Schaffer | H01L 21/76846 | |
| 9,385,183 B2* | 7/2016 | Chen | H01L 29/7395 | |
| 9,385,188 B2 | 7/2016 | Hirabayashi et al. | | |
| 9,406,666 B2* | 8/2016 | Naito | H01L 29/405 | |
| 9,431,249 B2* | 8/2016 | Pattanayak | H01L 21/266 | |
| 9,431,530 B2* | 8/2016 | Xu | H01L 29/7813 | |
| 9,472,614 B2* | 10/2016 | Cho | H01L 29/0634 | |
| 9,484,451 B2* | 11/2016 | Chen | H01L 29/0634 | |
| 9,614,043 B2* | 4/2017 | Azam | H01L 29/407 | |
| 9,666,664 B2* | 5/2017 | Kajitani | H01L 29/402 | |
| 9,842,911 B2* | 12/2017 | Tipirneni | H01L 29/66712 | |
| 2002/0195613 A1* | 12/2002 | Andoh | H01L 29/32 | 257/121 |
| 2006/0261391 A1* | 11/2006 | Nakazawa | H01L 27/0255 | 257/296 |
| 2008/0017897 A1* | 1/2008 | Saito | H01L 23/3192 | 257/288 |
| 2009/0079002 A1 | 3/2009 | Lee et al. | | |
| 2012/0273871 A1* | 11/2012 | Yedinak | H01L 29/872 | 257/329 |
| 2013/0248979 A1* | 9/2013 | Ono | H01L 29/7395 | 257/329 |
| 2013/0320462 A1* | 12/2013 | Tipirneni | H01L 21/266 | 257/409 |
| 2015/0144960 A1* | 5/2015 | Saia | H01L 29/49 | 29/78 |

\* cited by examiner

VERTICAL SEMICONDUCTOR DEVICE

PRIORITY CLAIM

This application claims priority to German Patent Application No. 10 2014 005 879.4 filed on 16 Apr. 2014, the content said application incorporated herein by reference in its entirety.

TECHNICAL FIELD

Embodiments of the present invention relate to vertical semiconductor devices, in particular to vertical power semiconductor devices having an active area and a peripheral area having an edge-termination structure and surrounding the active area.

BACKGROUND

Semiconductor transistors, in particular field-effect controlled switching devices such as a Metal Oxide Semiconductor Field Effect Transistor (MOSFET) or an Insulated Gate Bipolar Transistor (IGBT), have been used for various applications including but not limited to use as switches in power supplies and power converters, electric cars, air-conditioners, and even stereo systems. Particularly with regard to power devices capable of switching large currents and/or operating at higher voltages, low on-state resistance Ron, high breakdown voltages $U_{bd}$, ad/or high robustness are often desired.

Electrical properties of power semiconductor devices such as HVMOS power transistors, power diodes and power IGBTs, in particular their blocking capability (breakdown voltage $U_{bd}$) may change during operation. This unfavorable behavior may be due to mobile charges (ions, charged molecules), which penetrate from the package or from the outside into the semiconductor device and/or due to corrosion of metal electrodes. The charges may accumulate at the energetically most favorable position, for example, in the edge termination where they change the electric field distribution massively. For product development, there are standardized robustness tests in particular HTRB (high temperature reverse bias), H3TRB (high temperature high temperature reverse bias) and HTS (high temperature storage) tests. In these tests, many power components show an insufficient trade-off between robustness against external charges and robustness against moisture-related corrosion. Accordingly, there is a need to improve power semiconductor devices

SUMMARY

According to an embodiment of a vertical semiconductor device, the vertical semiconductor device includes a semiconductor body including a first surface, a second surface opposite to the first surface, and an edge extending in a vertical direction substantially perpendicular to the first surface, an active area, a peripheral area arranged in a horizontal direction substantially parallel to the first surface between the active area and the edge, and a pn-junction arranged next to the first surface and extending from the active area into the peripheral area. In the peripheral area the semiconductor device further includes a first conductive region arranged next to the first surface, a second conductive region arranged next to the first surface, and arranged in the horizontal direction between the first conductive region and the edge, and a passivation structure including in a vertical cross-section a first portion at least partly covering the first conductive region, a second portion at least partly covering the second conductive region. The first portion has a different layer composition than the second portion and/or a first thickness which differs from a second thickness of the second portion.

According to an embodiment of a vertical semiconductor device, the vertical semiconductor device includes a semiconductor body including a first surface, a second surface opposite to the first surface, an edge extending in a vertical direction substantially perpendicular to the first surface, an active area, a peripheral area arranged in a horizontal direction substantially parallel to the first surface between the active area and the edge, a pn-junction which is arranged next to the first surface, extends from the active area into the peripheral area, and is formed between a first semiconductor region and a second semiconductor region of the semiconductor body, a first metallization arranged on the first surface and in ohmic contact with the second semiconductor region, and a second metallization arranged on the second surface. In the peripheral area the semiconductor device further includes at least one field plate arranged on the first surface, and a passivation structure at least partly covering the field plate and having at a surface of the at least one field plate a varying thickness.

According to an embodiment of a method for forming vertical semiconductor device, the method includes providing a semiconductor body including a first surface, a second surface opposite to the first surface, an active area, a peripheral area surrounding the active area, a pn-junction arranged next to the first surface and extending from the active area into the peripheral area, forming a first dielectric layer on the first surface, forming in the peripheral area a field plate on the first dielectric layer, depositing a first passivation layer on the field plate, and at least reducing a thickness of the first passivation layer at least at a portion of the field plate.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
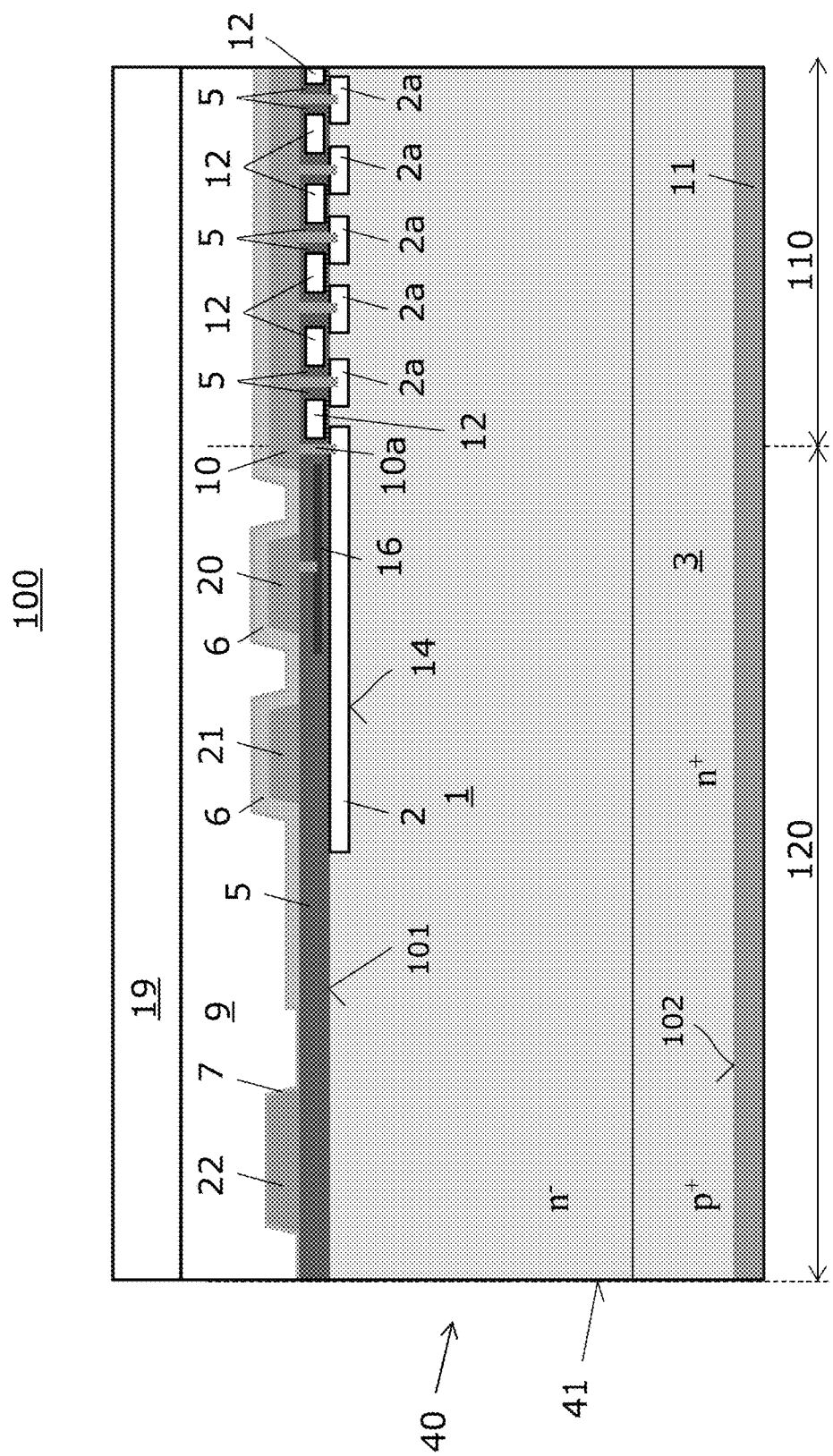
FIG. 1 illustrates a vertical cross-section through a semiconductor body of a semiconductor device according to an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body. Likewise, the term "horizontal" as used in this specification intends to describe an orientation which is substantially arranged parallel to the first surface.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "$n^-$" means a doping concentration which is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

Specific embodiments described in this specification pertain to, without being limited thereto, to field-effect semiconductor devices, in particular to field-effect compensation semiconductor devices and manufacturing methods therefor. Within this specification the terms "semiconductor device" and "semiconductor component" are used synonymously. The field-effect semiconductor device is typically a vertical semiconductor device such as a vertical MOSFET with a source metallization and an insulated gate electrode arranged on the first surface and a drain metallization arranged on a second surface arranged opposite to the first surface. Typically, the field-effect semiconductor device is a power semiconductor device having an active area with a plurality of MOSFET-cells for carrying and/or controlling a load current. Furthermore, the power semiconductor device has typically a peripheral area with at least one edge-termination structure at least partially surrounding the active area when seen from above.

The term "power semiconductor device" as used in this specification intends to describe a semiconductor device on a single chip with high voltage and/or high current switching capabilities. In other words, power semiconductor devices are intended for high current, typically in the Ampere range and/or voltages of more than about 10 V or even more than about 100 V or 500 V. Within this specification the terms "power semiconductor device" and "power semiconductor component" are used synonymously.

The term "edge-termination structure" as used in this specification intends to describe a structure that provides a transition region in which the high electric fields around an active area of the semiconductor device change gradually to the potential at or close to the edge of the device and/or between a reference potential such as ground and a high voltage e.g. at the edge and/or backside of the semiconductor device. The edge-termination structure may, for example, lower the field intensity around a termination region of a rectifying junction by spreading the electric field lines across the termination region.

The term "field-effect" as used in this specification intends to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between a source region of the first conductivity type and a drift region of the first conductivity type. The drift region may be in contact with a drain region. The drift region and the drain region are in low Ohmic contact with a drain electrode (drain metallization). The source region is in low Ohmic contact with a source electrode (source metallization). In the context of the present specification, the term "in Ohmic contact" intends to describe that there is a low-ohmic ohmic current path between respective elements or portions of a semiconductor device when no voltages or only small probe voltages are applied to and/or across the semiconductor device. Within this specification the terms "in Ohmic contact", "in resistive electric contact", "electrically coupled", and "in resistive electric connection" are used synonymously.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e. the term MOSFET is used in the more general term meaning of IGFET (insulated-gate field-effect transistor) and MISFET (metal-insulator-semiconductor field-effect transistor), respectively. The term "metal" for the gate material of the MOSFET should be understood to include or comprise electrical conductive materials like e.g. metal, alloys, doped polycrystalline semiconductors and metal semiconductor compounds like metal silicides.

In the context of the present specification, the term "gate electrode" intends to describe an electrode which is situated next to, and insulated from the body region and configured to form and/or control a channel region through the body region.

In the context of the present specification, the term "field electrode" intends to describe an electrode which is arranged next to a semiconductor region, typically the drift region, partially insulated from the semiconductor region, and configured to expand a depleted portion in the semiconductor region by charging to an appropriate voltage, typically a negative voltage with regard to the surrounding semiconductor region for an n-type semiconductor region.

In the context of the present specification, the term "mesa" or "mesa region" intends to describe a semiconductor region between two adjacent trenches extending into the semiconductor substrate or body in a vertical cross-section.

The term "commutating" as used in this specification intends to describe the switching of the current of a semiconductor device from a conducting direction in which a pn-load junction, for example the pn-junction between the body region and the drift region of a MOSFET, is forwardly biased to the opposite direction or blocking direction in which the pn-load junction is reversely biased. The term "hard commutating" as used in this specification intends to describe commutating with a speed of at least about $10^9$ V/s, more typically with a speed of at least about $5*10^9$ V/s.

In the following, embodiments pertaining to semiconductor devices and manufacturing methods for forming semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body comprises a high band gap material such as SiC or GaN which has a high breakdown field strength and high critical avalanche field strength, respectively, the doping of the respective semiconductor regions can be chosen higher which reduces the on-state resistance Ron in the following also referred to as on-resistance Ron.

With reference to FIG. 1, a first embodiment of a semiconductor device 100 is explained. FIG. 1 illustrates a vertical cross-section through a semiconductor body 40 of the semiconductor device 100. The semiconductor body 40 extends between a first surface 101, facing a vertical direction, and a second surface 102 arranged opposite to the first surface 101. In a horizontal direction that is substantially parallel to the first surface 101, the semiconductor body 40 is delimited by an edge 41, for example a sawing edge, extending between the first surface 101 and the second surface 102. The semiconductor body 40 has an active area 110 and a peripheral area 120 arranged between the active area and the edge 41. Typically, the peripheral area 120 surrounds the active area 110 when seen from above.

A first metallization typically forming a source metallization 10 is arranged on the first surface 101. A second metallization typically forming a drain metallization 11 is arranged on the second surface 102, i.e. opposite to the source metallization 10. Furthermore, a plurality of gate electrodes 12 may be arranged on the first surface 101 in the active area 110 and insulated from the source metallization 10 and the semiconductor body 40 by respective gate dielectric regions 5. The gate electrodes 12 are connected to a gate metallization that is not shown in FIG. 1 and typically also arranged on the first surface 101. Accordingly, the semiconductor device 100 may be operated as a three-terminal device (transistor). For sake of clarity, only a few of a plurality of transistor cells (unit cells) of active area 110 are illustrated in FIG. 1.

The semiconductor body 40 typically includes a bulk mono-crystalline material 3 and at least one epitaxial layer 1 formed thereon. Using the epitaxial layer(s) 1 provides more freedom in tailoring the background doping of the material since the doping concentration can be adjusted during deposition of the epitaxial layer or layers.

Alternatively, a thick wafer with a starting resistivity corresponding to the drift zone doping may be used for the fabrication of the devices whereby the final thickness of the device is adjusted by a thinning process performed after the realization of the device structure on the wafer front side. The highly doped layers on the wafer back side may be implemented after the thinning process, for example by ion implantation with a subsequent laser annealing process.

A pn-junction 14 is formed between an n-type first semiconductor region 1 typically forming a drift region and a p-type second semiconductor region 2 of the semiconductor body 40. The pn-junction 14 is arranged next to the first surface 101, extends from the active area 110 into the peripheral area 120, and forms a rectifying junction between the first metallization 10 and the second metallization 11.

In the exemplary embodiment, the second semiconductor region 2 extends to the first surface 101 both in the active area 110 and the peripheral area 120. An innermost portion of the second semiconductor region 2 may form a body region of an outermost transistor-cell.

In embodiments referring to field-effect semiconductor devices, the active area 110 may be defined by the presence of insulated gate electrodes 5, 12 configured to form and/or change a channel region in an adjacent p-type body region 2a between an adjoining n-type source region (not shown in FIG. 1) in Ohmic contact with the source metallization 10 and a drift region 1 (first semiconductor region 1). The doping relations may, however, also be reversed. The active area 110 may also be defined by the presence of active cells, such as diode-cells, MOSFET-cells and IGBT-cells, for carrying a load current between the source metallization 10 and the drain metallization 11.

As illustrated in FIG. 1, the body regions 2a of the active area 110 and the second semiconductor region 2 may be connected to the source metallization 10 via respective conductive plugs 10a.

In the exemplary embodiment illustrated in FIG. 1, the transistor cells of active area 110 are implemented as n-channel DMOS-structures with respective gate electrodes 12 arranged on the first surface 101.

According to another embodiment, the gate electrode(s) 12 and the gate dielectric(s) 5 are formed in a respective trenches extending from the first surface 101 into the semiconductor body 40. In this embodiment, the body region 2a and source region adjoin an upper part of the respective trench while the drift region 1 adjoins a lower part of the respective trench. In this embodiment, the drift region 1 may not extend to the first surface 101 in the active area 110.

In the exemplary embodiment illustrated in FIG. 1, the semiconductor body 40 may include a highly doped n-type drain region 3 that extends to the second surface 102 and is in Ohmic contact with the drain metallization 11.

Additionally, an n-type field-stop region (not shown in FIG. 1) may be arranged between the drain region 3 and the drift region 1. The drain region 3, the optional field-stop region 3 and the drift region 1 (first semiconductor region 1) are typically arranged in the active area 110 and the peripheral area 120 and may extend to the edge 41.

In embodiments referring to diodes, the semiconductor body 40 may include a plurality of p-type 2a anode regions 2a arranged in the active area 110 and in Ohmic contact with an anode metallization 10, and a highly doped n-type cathode region 3 that extends to the second surface 102 and is in Ohmic contact with a cathode metallization 11.

In embodiments referring to IGBTs, the semiconductor body 40 includes a highly doped p-type collector region 3 instead of an n-type drain region. In these embodiments the first metallization 10 and the second metallization 11 form an emitter metallization 10 and a collector metallization 11, respectively.

In embodiments referring to IGBTs with integrated freewheeling diode(s), the semiconductor body 40 includes at the second surface 102 a highly doped layer 3 having one or more p-type collector portions and one or more n-type cathode regions which are both in Ohmic contact with the second metallization 11 forming a common collector-anode metallization 11.

The second metallization 11 is typically arranged both in the active area 110 and the peripheral area 120. The second metallization 11 may even completely cover the second surface 102 and extend to the edge 41, respectively.

In the exemplary embodiment illustrated in FIG. 1, the semiconductor device 100 includes in the peripheral area 120 two first conductive regions 20, 21 and a second conductive region 22 which are arranged on the first surface 101, separated from the semiconductor body 40 by a first dielectric layer 5 arranged on the first surface 101, and implemented as field plates. Accordingly, the semiconductor device 10 is provided with edge-termination structures to ensure a sufficiently high break-down voltage. For example, the second conductive region 22 arranged closest to the edge 41 may be in Ohmic contact with the second metallization 11 (drain metallization), e.g. via the semiconductor body 40, while the innermost first conductive region 20 may be in Ohmic contact with the gate metallization (not shown in FIG. 1) and a poly-silicon gate contact layer 16, and the conductive regions 21 may be floating.

The first dielectric layer 5 is typically a silicon oxide layer, for example a thermal oxide layer.

Typically, the first and second conductive regions 20, 21, 22 are made of the same material and/or may have the same composition as the source metallization 10 and the gate metallization, respectively.

When seen form above, the first and second conductive regions 20, 21, 22 typically surround the active area 110.

The first and second conductive regions 20, 21, 22 may be substantially ring-shaped, for example annular when seen from above. In these embodiments, the first and second conductive regions 20, 21, 22 may, depending on contact, form a gate ring 20, a floating ring 21 and a drain ring 22, respectively.

An outermost portion of the source metallization 10 may form a source field plate. Depending on design, the semiconductor device 100 may also include a separate source ring.

According to an embodiment, a passivation structure 6, 7 having a first portion (inner portion) covering the first conductive regions 20, 21, and a second portion (outer portion) covering the second conductive region 22.

In the exemplary embodiment, the first portion has a first thickness which is higher than a second thickness of the second portion.

The first and second portions may share at least one passivation layer 7, i.e. include respective parts of a contiguous passivation layer 7.

The thickness of the first and second portions of the passivation structure 6, 7 is typically measured in normal direction of adjoining surfaces of the conductive regions 20, 21, 22 (layer thickness) and may refer to a minimum thickness, a maximum thickness, or an average thickness if not explicitly specified. When the thickness of the passivation structure 6, 7 covering different first and second conductive regions 20, 21, 22 is compared, the same definition is used.

Typically, the thickness of the first and second portions of the passivation structure 6, 7 (inner and outer portions of the passivation structure 6, 7) differ by at least 50%, more typically by factor of at least about five, even more typically by factor of at least about 10. For example, the thickness of the second portion of the passivation structure 6, 7 may be lower than about 100 nm, for example in a range from about 5 nm to 15 nm or 20 nm, and the thickness of the first portion of the passivation structure 6, 7 may be in a range from about 200 nm to about 800 nm.

Further, the first conductive regions 20, 21 of semiconductor device 100 are covered by a stack of two layers 6, 7 with a first passivation layer 6 directly covering the first conductive regions 20, 21 and a second passivation layer 7 arranged thereon, while the second conductive regions 22 is directly covered by the second passivation layer 7.

The first passivation layer 6 and the second passivation layer 7 are typically made of different materials such as silicon oxide, silicon nitride, silicon oxynitride or a semi-insulating material such as diamond-like carbon.

In the exemplary embodiment illustrated in FIG. 1, the first passivation layer 6 is thicker than the second passivation layer 7. In other embodiments, the first passivation layer 6 is thinner than the second passivation layer 7. The first and second passivation layer 6, 7 may also have substantially the same thickness.

Furthermore, the passivation structure 6, 7 may have more than two passivation layers 6, 7.

As illustrated in FIG. 1, the passivation structure 6, 7 and passivation layers 7, 6, respectively, typically also cover the source metallization 10 in the active area 110.

In one embodiment, the first portion of the passivation structure 6, 7 is formed as an oxide-nitride-stack 6, 7 with a thickness of the oxide 6 of about 100 nm to about 5 µm, more typically in a range from about 100 nm to about 3 µm; and a thickness of the nitride 7 in a range from about 100 nm to about 1 µm, and the second portion of the passivation structure 6, 7 is formed by a nitride 7 with a thickness in a range from 0 to about 100 nm.

A second dielectric layer 9, for example an organic dielectric layer such as an imide-layer, is typically arranged on the passivation structure 6, 7 in the active area 110 and the peripheral area 120. The first dielectric layer 5 and the second dielectric layer 9 are also referred to as further dielectric layer 5 and dielectric layer 9, respectively.

Further, a sealing layer 19, e.g. a mould compound or isolating gel, is typically arranged on the dielectric layer 9 in the active area 110 and the peripheral area 120.

Due to using a thinner passivation structure on the outer conductive region 22 compared to the inner conductive regions 20, 21, both a good robustness against penetration of external charges and against moisture induced damages may be achieved. This is confirmed by numerical simulations.

Figure 2:
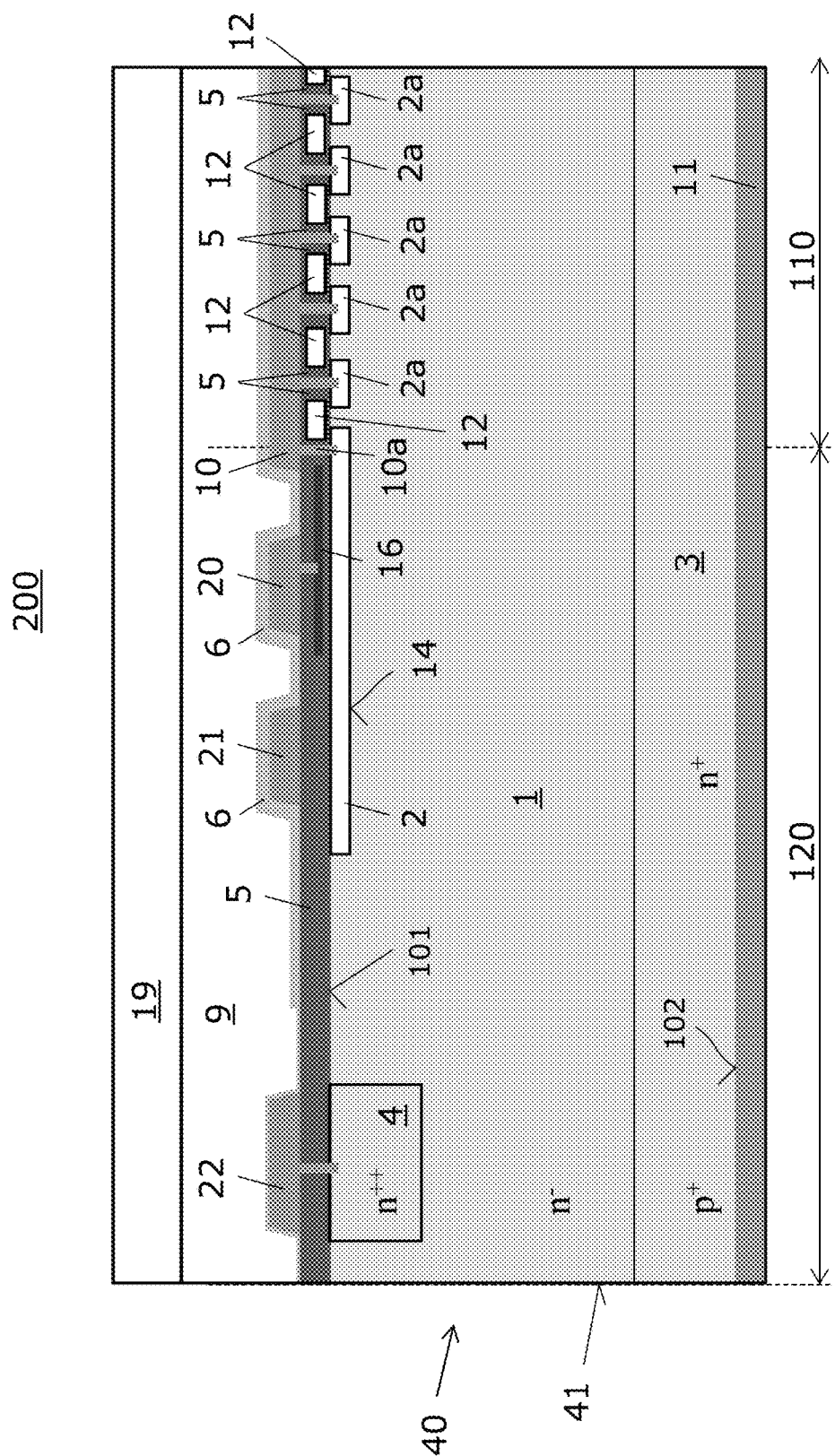
FIG. 2 illustrates a vertical cross-section through a semiconductor body of a vertical semiconductor device according to an embodiment.

FIG. 2 illustrates a vertical cross-section through a vertical semiconductor device 200. The semiconductor device 200 is similar to the semiconductor device 100 explained above with regard to FIG. 1 and may also be operated as a power field-effect transistor. However, the passivation structure 6, 7 of semiconductor device 200 is formed by one passivation layer 6 only which has a lower thickness on (and next to) the second conductive region 22 compared to the portion on the first conductive regions 20, 21 and the active area 110.

Furthermore, a highly n-doped channel-stopper region 4 is arranged in the first semiconductor region 1 next to the first surface 101 and the edge 41. In other embodiments, the channel-stopper region 4 is highly p-doped.

Figure 3:
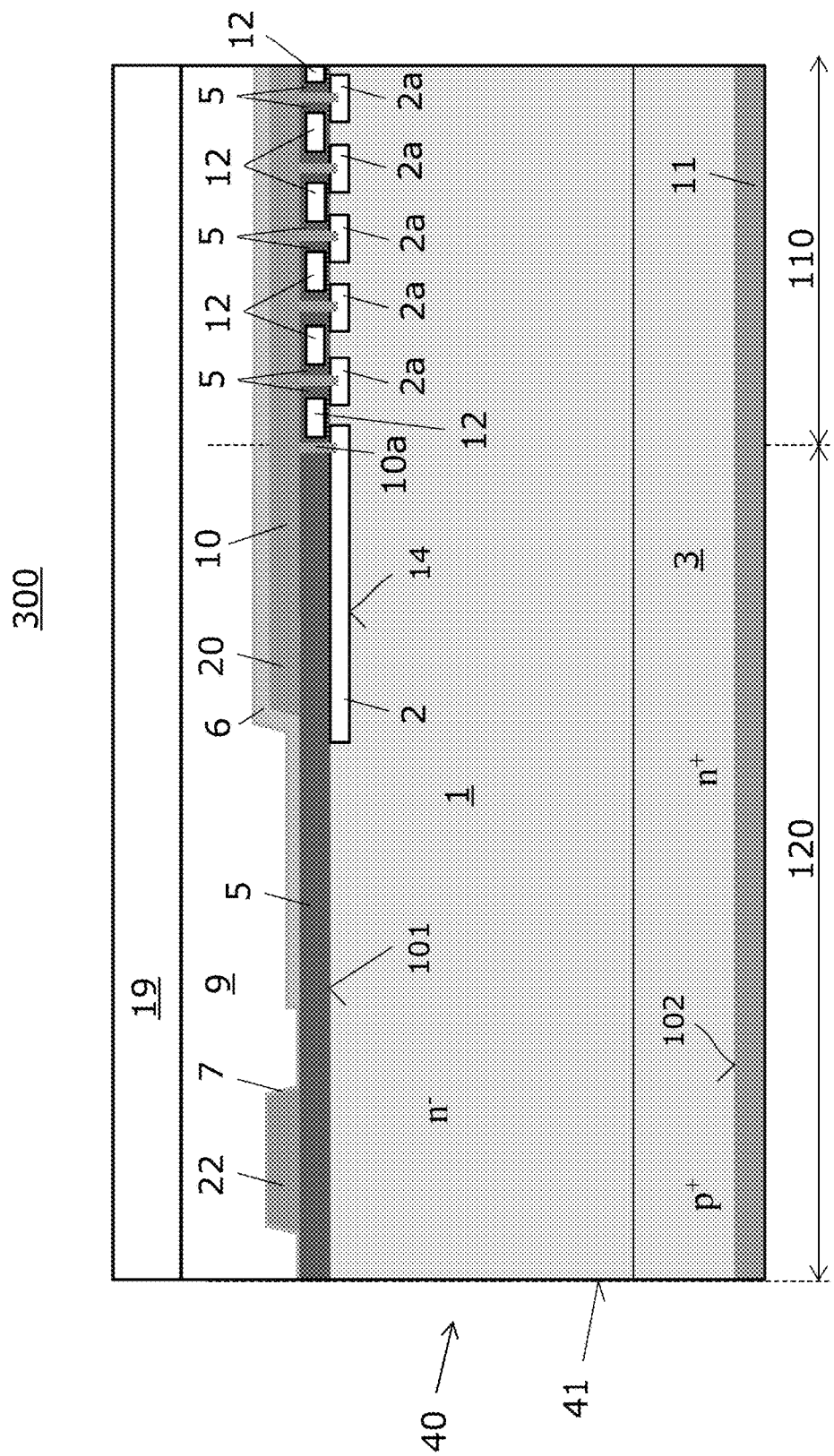
FIG. 3 illustrates a vertical cross-section through a semiconductor body of a vertical semiconductor device according to an embodiment.

FIG. 3 illustrates a vertical cross-section through a vertical semiconductor device 300. The semiconductor device 300 is similar to the semiconductor device 100 explained above with regard to FIG. 1 and may also be operated as a power field-effect transistor. However, there is no gate field plate 21 in the peripheral area 120 of semiconductor device 300.

Further, the first conductive region of semiconductor device 300 is formed by an outermost portion 20 of the first metallization 10 forming a source field plate in the peripheral area 120.

Figure 4:
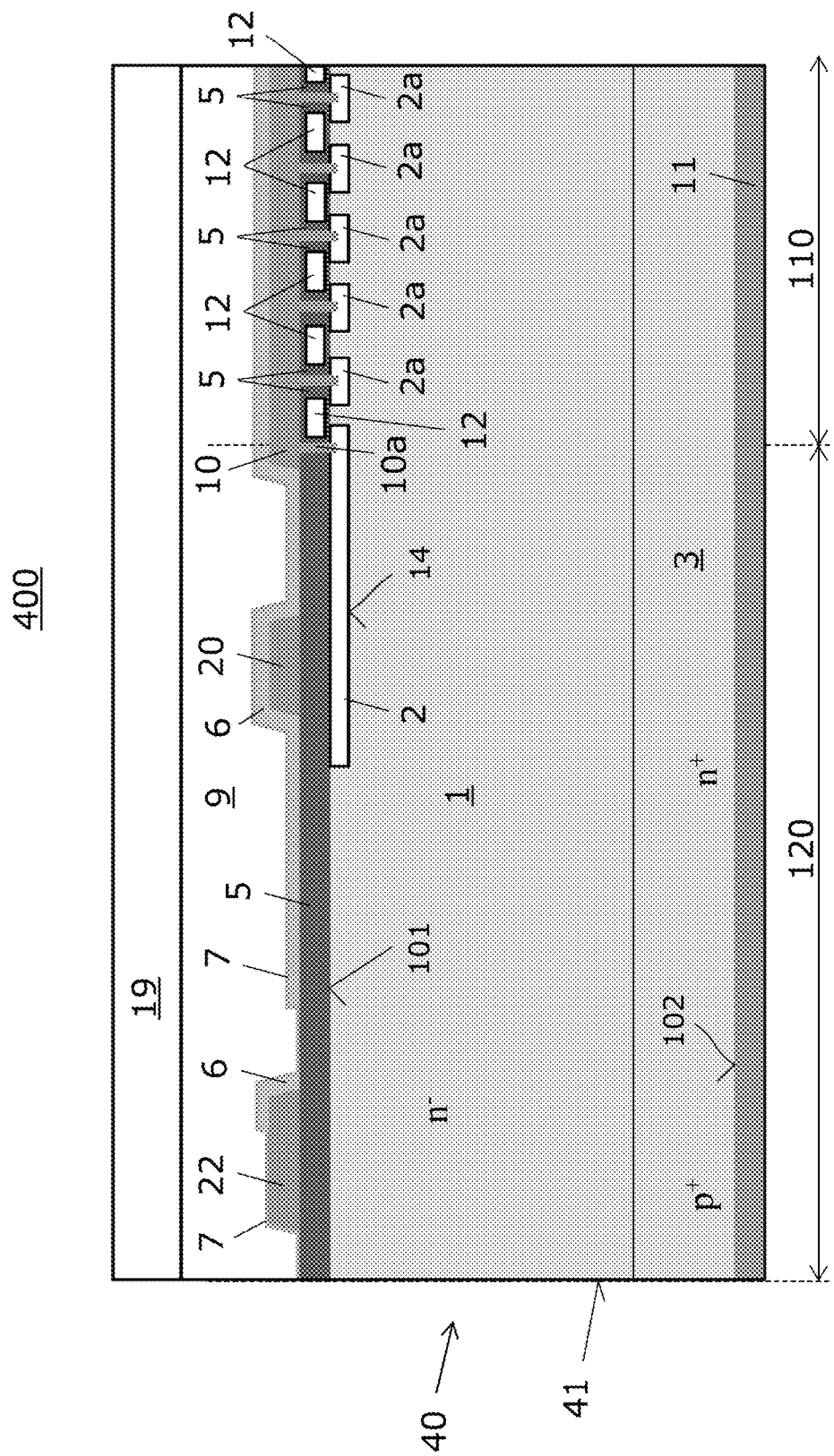
FIG. 4 illustrates a vertical cross-section through a semiconductor body of a vertical semiconductor device according to an embodiment.

FIG. 4 illustrates a vertical cross-section through a vertical semiconductor device 400. The semiconductor device 400 is similar to the semiconductor device 100 explained above with regard to FIG. 1 and may also be operated as a power field-effect transistor. However, there is only one first conductive region 20 in the peripheral area 120 of semiconductor device 400.

Furthermore, the thickness of the passivation structure 6, 7 is varied on the second conductive region 22. In an inner edge region of the second conductive region 22 the thickness of the passivation structure 6, 7 is higher compared to regions closer to the chip edge 41. Accordingly, a thicker passivation is provide at the second conductive region 22 (field plate) where a comparatively high electric field is expected during a blocking mode of the semiconductor device 400 (reverse biasing the pn-junction 14).

Accordingly, the trade-off between robustness against external charges and robustness against moisture-related corrosion may be further improved.

According to an embodiment, the peripheral area 120 of the semiconductor device 400 includes a field plate 20 which is covered by a passivation structure 6, 7 having a varying thickness.

Figure 5:
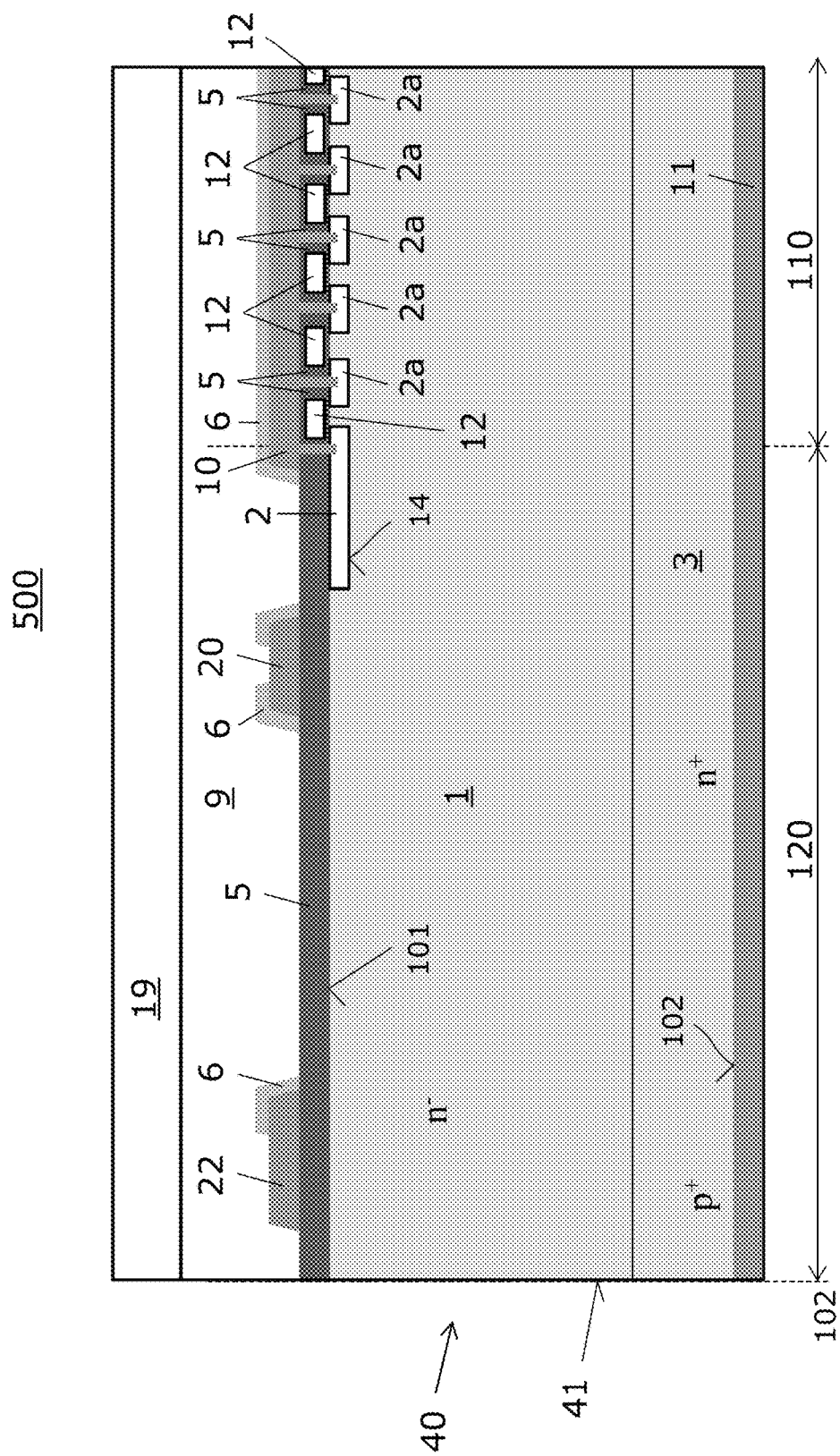
FIG. 5 illustrates a vertical cross-section through a semiconductor body of a vertical semiconductor device according to an embodiment.

FIG. 5 illustrates a vertical cross-section through a vertical semiconductor device 500. The semiconductor device 500 is similar to the semiconductor device 400 explained above with regard to FIG. 4 and may also be operated as a power field-effect transistor. However, the passivation structure 6 is formed by the first passivation layer 6 only.

Further, the passivation structure 6 covers only edge portions of the first conductive region 20.

According to an embodiment, the peripheral area 120 of the semiconductor device 500 includes field plate 20 22 each of which is only partly covered by a passivation structure 6.

Furthermore, the passivation structure 6 may at least in a vertical cross-section be disconnected as illustrated in FIG. 5.

Figure 6:
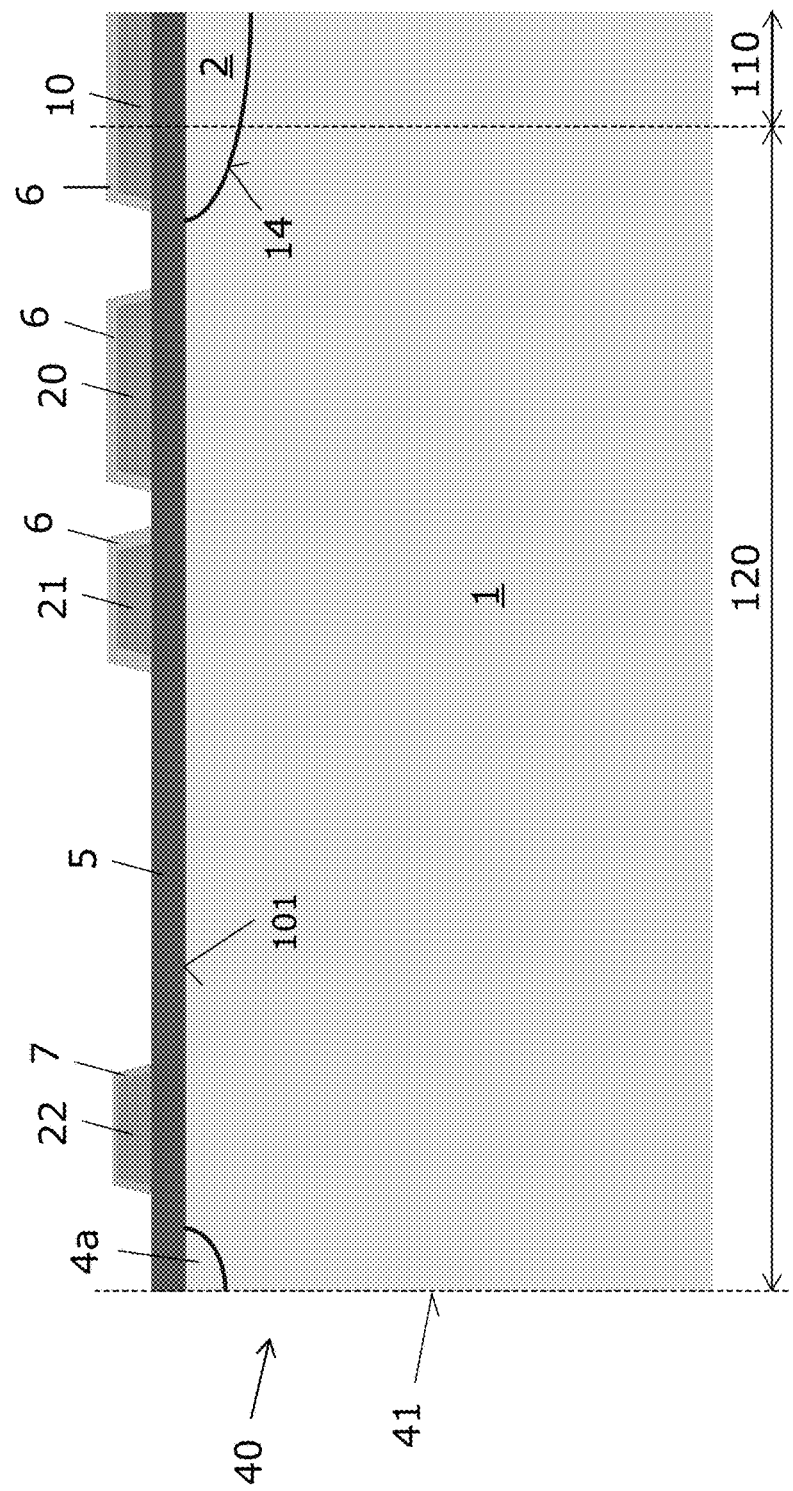
FIG. 6 illustrates a vertical cross-section through a semiconductor body of a vertical semiconductor device according to an embodiment.

FIG. 6 illustrates a vertical cross-section through a vertical semiconductor device 600. The semiconductor device 600 is similar to the semiconductor device 100 explained above with regard to FIG. 1. Semiconductor device 600 may be operated as a power diode or a as power field-effect transistor. However, the passivation structure 6, 7 is formed on the first conductive regions 20, 21 by portions of the first passivation layer 6 and on the second conductive region by a thinner second passivation layer 7.

The first conductive regions 20, 21 may be floating semiconductor regions.

Further, semiconductor device 600 has higher doped field-stopper semiconductor region 4a extending to the first surface 101 and the edge 41.

In the exemplary embodiment illustrated in FIG. 6, the second semiconductor region 2 and the first conductive regions 20, 21 do not overlap when seen from above.

Figure 7:
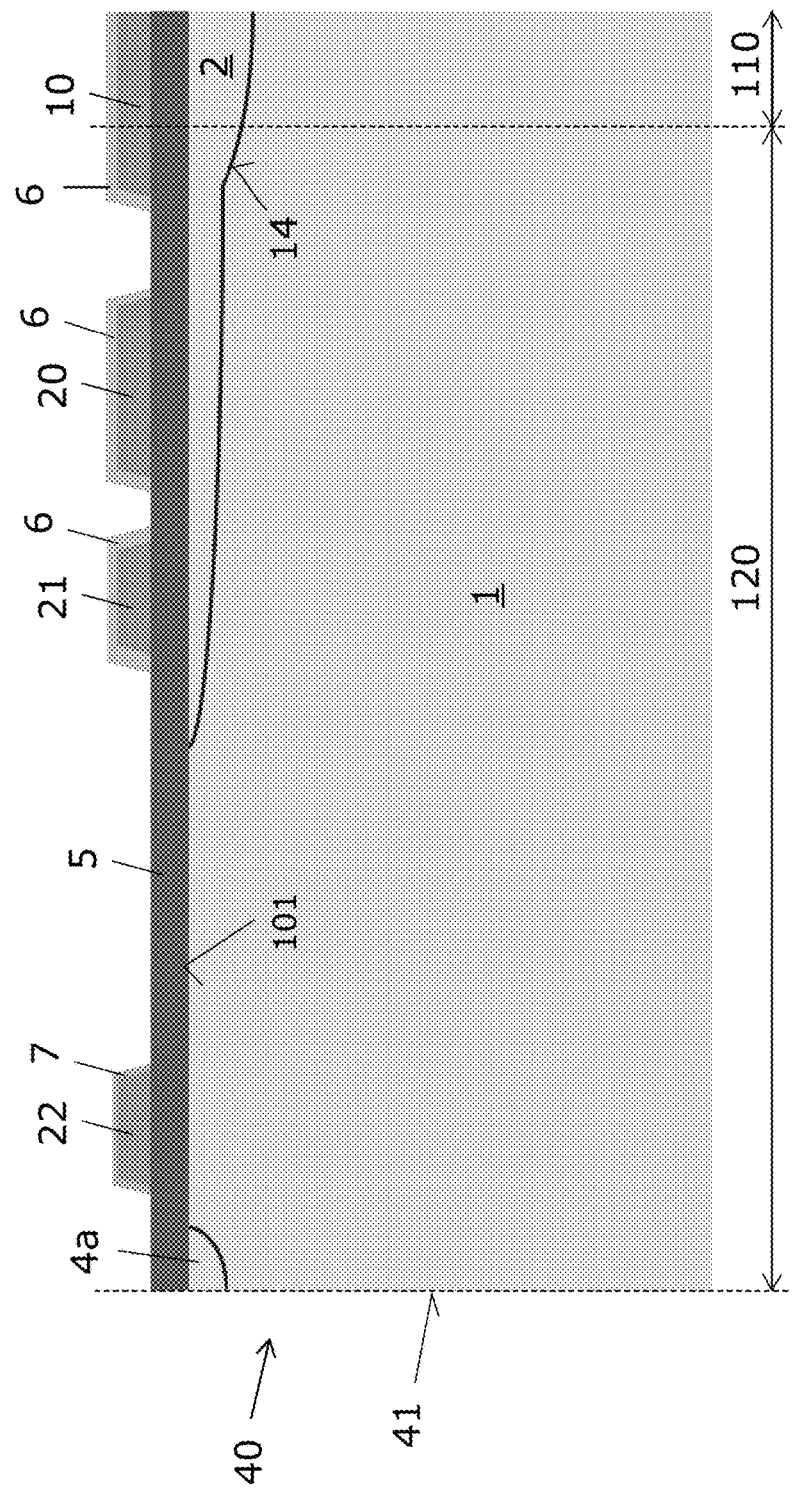
FIG. 7 illustrates a vertical cross-section through a semiconductor body of a vertical semiconductor device according to an embodiment.

FIG. 7 illustrates a vertical cross-section through a vertical semiconductor device 700. The semiconductor device 700 is similar to the semiconductor device 600 explained above with regard to FIG. 6. However, the second semiconductor region 2 and the first conductive regions 20, 21 do overlap when seen from above. The field plates 20, 21 may have ohmic contact with the underlying p-doped second semiconductor region 2.

Figure 8:
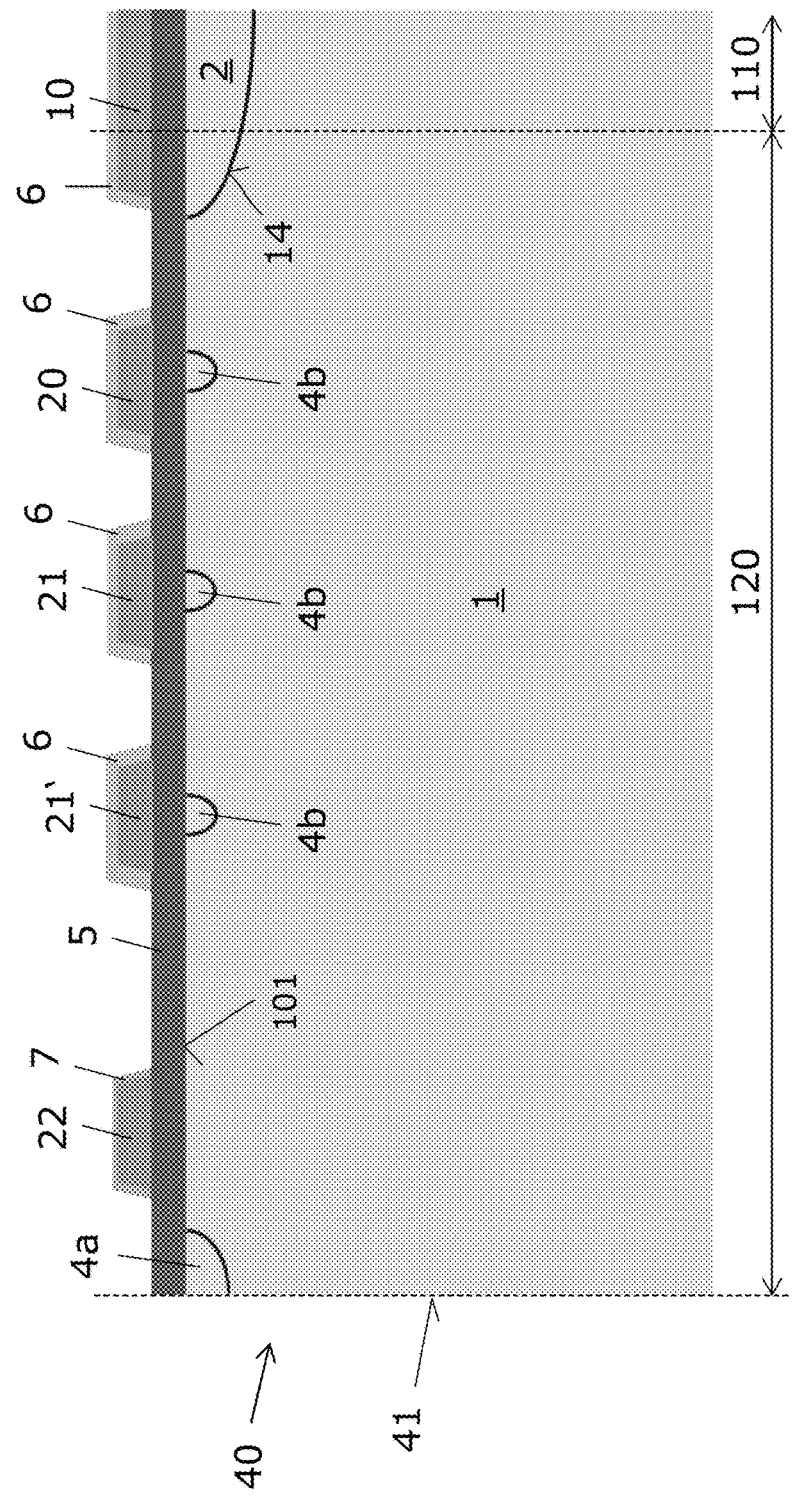
FIG. 8 illustrates a vertical cross-section through the semiconductor body of a vertical semiconductor device according to an embodiment.
Figure 9:
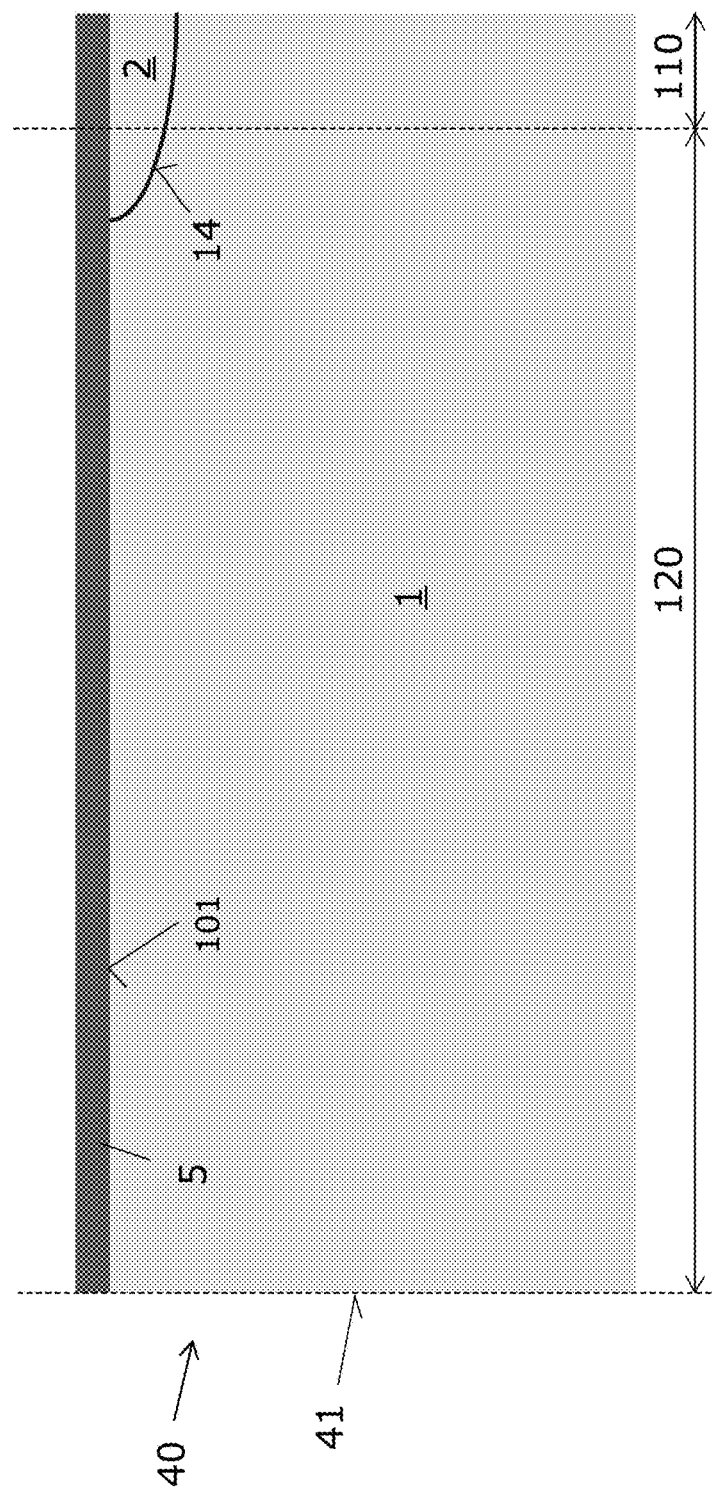
FIG. 9 to FIG. 12 illustrate vertical cross-sections through a semiconductor body during method steps of a method according to embodiments.

FIG. 8 illustrates a vertical cross-section through a vertical semiconductor device 800. The semiconductor device 800 is similar to the semiconductor device 600 explained above with regard to FIG. 6.

In the exemplary embodiment illustrated in FIG. 8, three floating first semiconductor regions 20, 21, 21' are arranged on the first surface 101 in the peripheral area 120 of semiconductor device 800 which overlap with three (p-type) floating guard rings 4b each of which forms a respective pn-junction with the first semiconductor region 1. The field plates 20, 21, 21' may have ohmic contact to the respective guard rings 4b.

With regard to FIGS. 9 through 12, method steps of a method for forming a vertical semiconductor device 900 are illustrated in respective vertical cross-sections through a semiconductor body 40. For sake of clarity each of the Figures illustrates only a left part of one of a plurality of semiconductor devices 900 which are typically manufactured in parallel on wafer-level.

In a first step, a semiconductor substrate or wafer 40, for example a Si-wafer, extending between a first or upper surface 101 and a second or back surface (not shown) arranged opposite to the main surface 101 is provided. Typically, the wafer 40 includes a first semiconductor layer 1 of a first conductivity type (n-type) extending to the first surface 101, a (p-type) second semiconductor region 2 at the first surface and forming a pn-junction 14 with the first semiconductor layer 1, and a higher doped third semiconductor layer (not shown) extending to the second surface of the semiconductor wafer 40.

Figure 10:
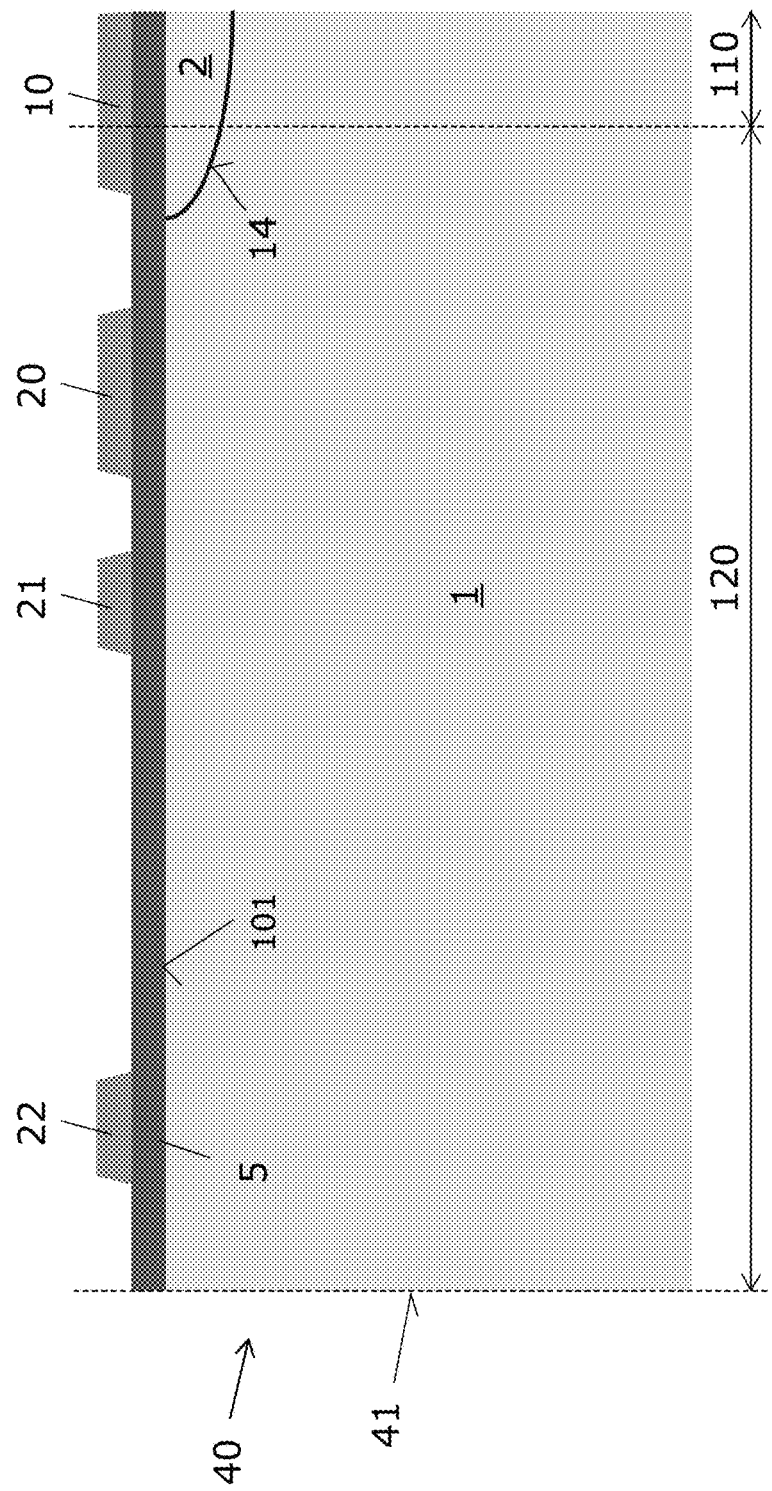

FIG. 10 illustrates the semiconductor structure 900 after forming a first dielectric layer 5 on the first surface 101, for example by thermal oxidation. The shown edge 41 corresponds to a later formed sawing edge.

In the exemplary embodiment, the pn-junction 14 extends to the first surface 101 in the peripheral area 120.

Thereafter, one or more field plates 20, 21, 22 may be formed on the first dielectric layer 5. This typically includes depositing a highly conductive layer such as metal layer and masked etching.

As illustrated in FIG. 10, the field plates 20, 21, 22 are typically formed together with a first metallization 10 on the first surface 101.

In embodiments referring to forming power field-effect semiconductor devices, a plurality of field-effect structures with respective insulated gate electrodes is typically formed in the active area 110 next to the first surface 101 prior to forming the field plates 20, 21, 22 and the first metallization 10, respectively.

Figure 11:
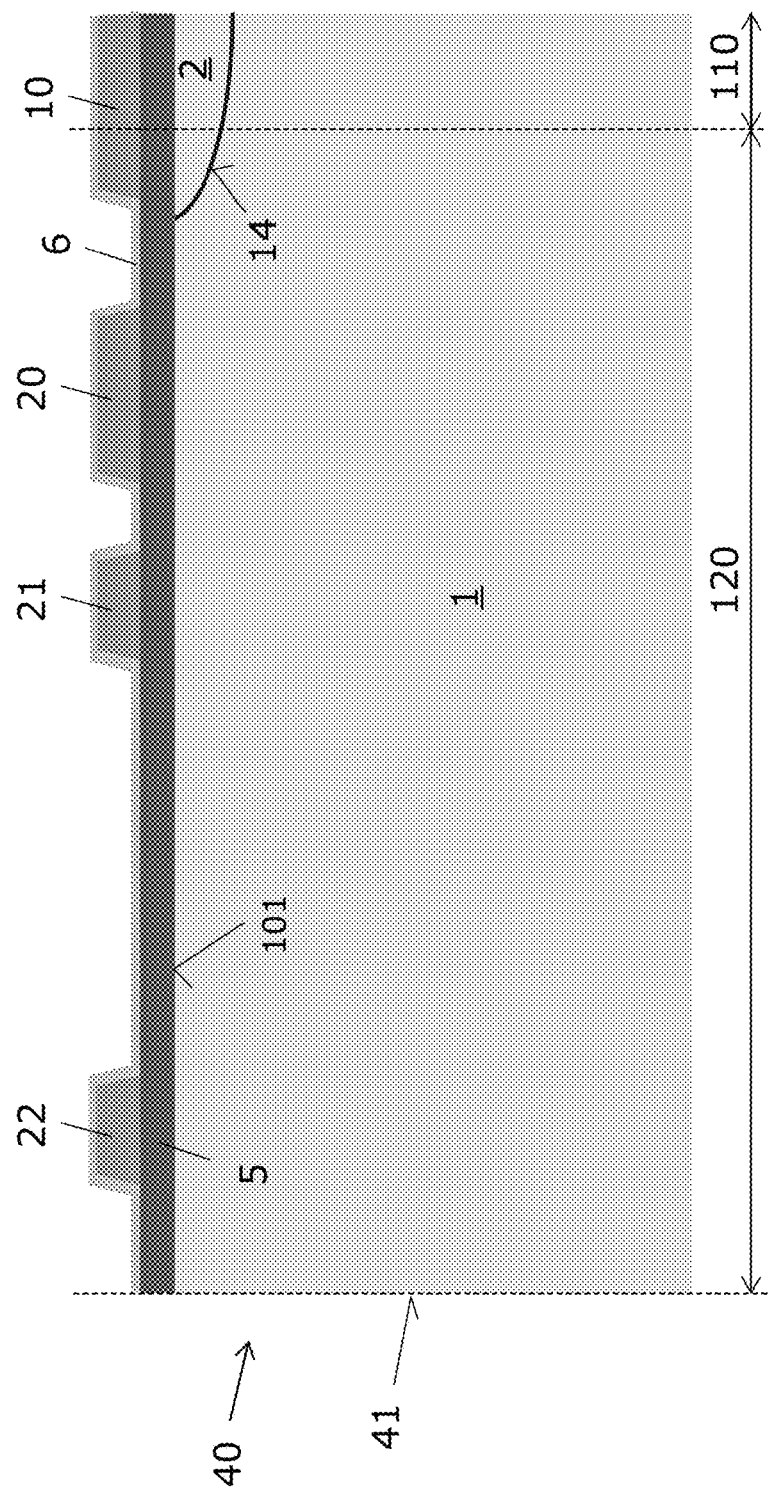

Thereafter, a first passivation layer 6 may be deposited on the field plate 20, 21, 22, for example as a conformal layer using a CVD-process. The resulting semiconductor structure 900 is illustrated in FIG. 11.

Figure 12:
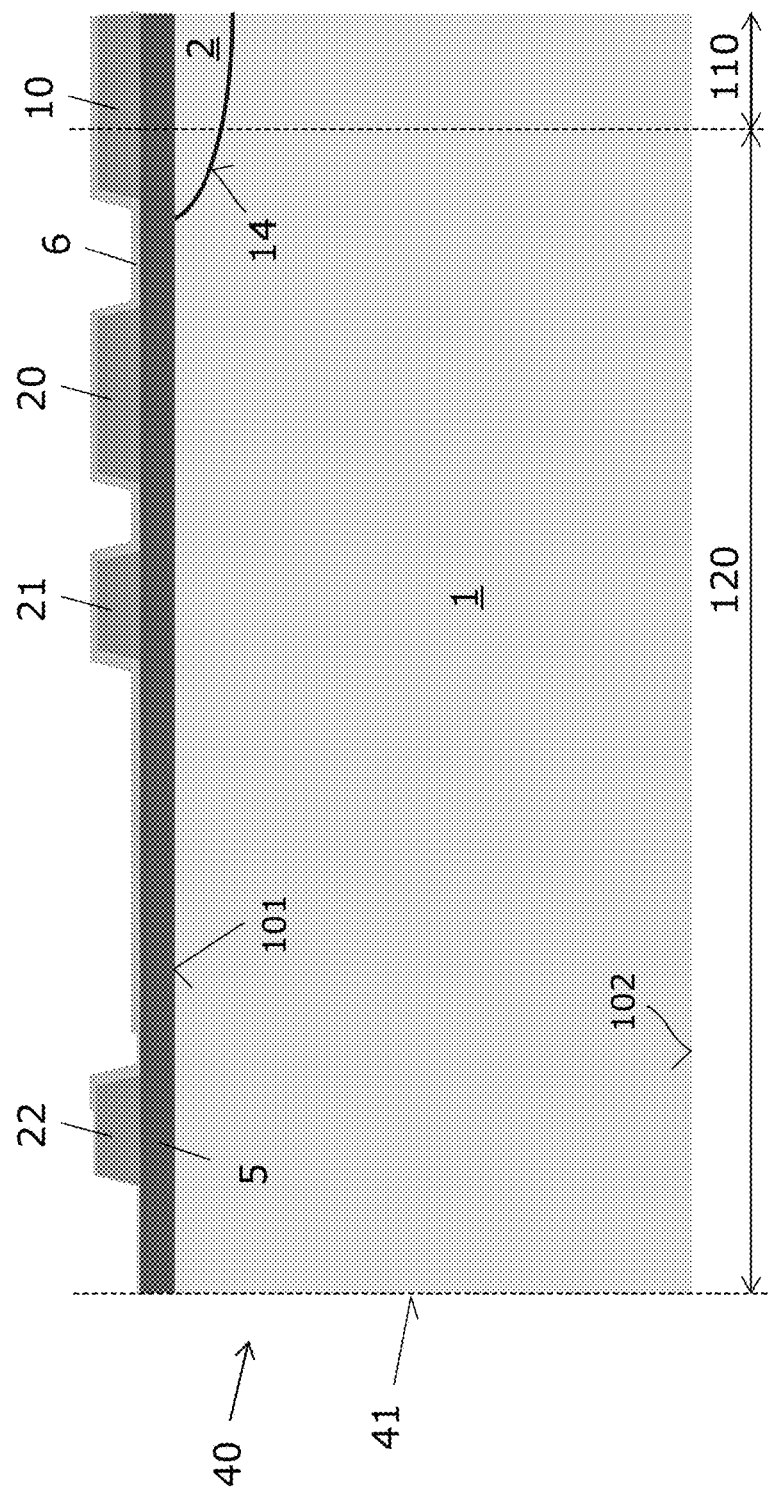

Thereafter, the thickness of the first passivation layer 6 of at least an outermost portion of the outermost field plate 22 may be reduced, e.g. by masked etching. The resulting semiconductor structure 900 is illustrated in FIG. 12 illustrating an embodiment in which the thickness of the first passivation layer 6 is reduced such that a minimum thickness of the first passivation layer 6 at the outermost field plate 22 (having a larger distance to the active area than the other field plates 20, 21, is closest to the edge 41 after sawing) is thinner than a minimum thickness at the other field plate 20, 21 while the maximum thickness of the first passivation layer 6 is substantially the same on the field plates 20, 21, 22.

In other embodiments, the first passivation layer 6 is thinned to substantially the same fraction, e.g. to less than about 50%, more typically less than about 20%, and even more typically less than about 10%, on all adjoining surfaces of the outermost field plate 22.

Thereafter or prior to forming the first passivation layer 6, a second passivation layer (not shown) may be formed on the first passivation layer 6 or on the field plates 20, 21, 22, for example as a conformal layer. In these embodiments, the first passivation layer 6 may also be completely removed from the outermost field plate 22. The second passivation layer is typically thinner than the first passivation layer, for example by a factor of at least about 5 or even 10.

Thereafter, a second dielectric layer may be formed on the first passivation layer 6 and the second passivation layer, respectively.

Thereafter, a sealing compound may be deposited on the second dielectric layer.

Thereafter, a second metallization in Ohmic contact with second semiconductor region 2 and the outermost field plate 22 may be formed on the second surface 102.

Thereafter, the wafer 40 may be divided into separate semiconductor devices 900, e.g. by sawing.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A vertical semiconductor device, comprising:
  a semiconductor body comprising a first surface, a second surface opposite the first surface, an edge extending in a vertical direction substantially perpendicular to the first surface, an active area, a peripheral area arranged in a horizontal direction substantially parallel to the first surface between the active area and the edge, and a pn-junction arranged next to the first surface and extending from the active area into the peripheral area, wherein in the peripheral area the semiconductor device further comprises:

a first conductive layer disposed on the first surface;

a second conductive layer disposed on the first surface, and arranged in the horizontal direction between the first conductive layer and the edge such that there is no other conductive layer arranged between the second conductive layer and the edge; and an electrically insulating passivation structure;

wherein the passivation structure comprises a thicker section and a thinner section, wherein the first conductive layer and the second conductive layer each comprises an upper surface opposite from the first surface of the semiconductor body, wherein in a cross-sectional plane of the semiconductor device the thicker section of the passivation structure completely covers and directly contacts the entire upper surface of the first conductive layer, and wherein the thinner section of the passivation structure covers and directly contacts the upper surface of the second conductive layer, wherein the thicker section comprises an upper surface which traces an upper surface profile of the first conductive layer, and wherein the thinner section comprises an upper surface which traces an upper surface profile of the second conductive layer, wherein the upper surface profile of the first conductive layer comprises the upper surface of the first conductive layer and side surfaces that extend from the upper surface of the first conductive layer toward the first surface, and wherein the upper surface profile of the second conductive layer comprises the upper surface of the second conductive layer and side surfaces that extend from the upper surface of the second conductive layer toward the first surface.

2. The vertical semiconductor device of claim 1, wherein at least one of the first conductive layer and the second conductive layer is arranged on the first surface and formed as a field plate.

3. The vertical semiconductor device of claim 1, further comprising at least one dielectric layer arranged on the passivation structure.

4. The vertical semiconductor device of claim 3, wherein the at least one dielectric layer comprises an organic material.

5. The vertical semiconductor device of claim 1, wherein the pn-junction extends in the peripheral area to the first surface.

6. The vertical semiconductor device of claim 1, wherein the active area comprises a plurality of insulated gate bipolar transistor (IGBT)-cells, metal oxide semiconductor field effect transistor (MOSFET)-cells or diode-cells.

7. The vertical semiconductor device of claim 1, wherein the first and second conductive layers are electrically isolated from one another.

8. The vertical semiconductor device of claim 1, wherein the first conductive layer comprises a first edge side that is angled relative to the first surface, wherein the second conductive layer comprises a second edge side that is angled relative to the first surface, and wherein a portion of the passivation structure is disposed within a gap that laterally separates the first edge side from the second edge side.

9. The vertical semiconductor device of claim 1, further comprising a dielectric layer arranged on the first surface of the semiconductor body, wherein the first conductive layer and the second conductive layer are arranged on the dielectric layer such that lower surfaces of the first conductive layer and the second conductive layer are separated from the first surface of the semiconductor body by the dielectric layer.

* * * * *